(12) United States Patent
Min (10) Patent No.: US 7,183,768 B2
(45) Date of Patent: Feb. 27, 2007

(54) ULTRA SENSITIVE IN-SITU MAGNETOMETER SYSTEM

(76) Inventor: Dong-Hoon Min, 408 Dongsak-dong, Pyungtak, Kyunggi-do (KR) 450-802

( * ) Notice: Subject to any disclaimer, the term of this patent is extended or adjusted under 35 U.S.C. 154(b) by 0 days.

(21) Appl. No.: 10/569,641

(22) PCT Filed: Sep. 1, 2004

(86) PCT No.: PCT/KR2004/002194

§ 371 (c)(1),
(2), (4) Date: Feb. 27, 2006

(87) PCT Pub. No.: WO2005/022182

PCT Pub. Date: Mar. 10, 2005

(65) Prior Publication Data

US 2007/0007956 A1    Jan. 11, 2007

(30) Foreign Application Priority Data

Sep. 2, 2003  (KR) .................. 10-2003-0061235
Aug. 31, 2004 (KR) .................. 10-2004-0069156

(51) Int. Cl.
*G01R 33/00* (2006.01)

(52) U.S. Cl. .................. 324/260; 324/244; 324/249
(58) Field of Classification Search ............. 324/244, 324/249, 260
See application file for complete search history.

(56) References Cited

U.S. PATENT DOCUMENTS

| 5,015,953 | A | 5/1991 | Ferguson et al. |
| 5,142,229 | A | 8/1992 | Marsden |
| 5,739,686 | A | 4/1998 | Naughton et al. |
| 5,977,767 | A | 11/1999 | Chaparala |

OTHER PUBLICATIONS

International Search Report for PCT/KR2004/002194 dated Jan. 7, 2005.

*Primary Examiner*—Bot LeDynh
(74) *Attorney, Agent, or Firm*—Roberts, Mlotkowski & Hobbes; Thomas W. Cole (57) ABSTRACT

The present invention relates to an ultra sensitive in-situ magnetometer system, and more particularly to an ultra sensitive in-situ magnetometer system that can in-situ monitor a magnetic moment of a magnetic thin film with sub-monolayer precision while depositing and growing the magnetic thin film in an ultra high vacuum (UHV) chamber.

16 Claims, 6 Drawing Sheets

ULTRA SENSITIVE IN-SITU MAGNETOMETER SYSTEM

TECHNICAL FIELD

The present invention relates to an ultra sensitive in-situ magnetometer system, and more particularly to an ultra sensitive in-situ magnetometer system that can in-situ monitor a magnetic moment of a magnetic thin film with sub-monolayer precision or more while depositing and growing the magnetic thin film in an ultra high vacuum (UHV) chamber.

BACKGROUND ART

Conventionally, a magnetic sensor for monitoring the magnetic moment of a magnetic thin film can be implemented using the Hall effect, the magnetoresistance effect, an induction coil, a superconducting quantum interference device (SQUID), etc. A method for measuring a magnetic field using the magnetic sensor is used as the monitoring method.

First, a method using the Hall effect uses a phenomenon in which electromotive force is generated as an electric field is generated in a direction perpendicular to an electric current direction and a magnetic field direction when the magnetic field is applied to a plate into which current flows.

Next, a method using the magnetoresistance effect uses a phenomenon in which electric resistance varies in proportion to the square of the strength of a magnetic field. Moreover, this method measures the magnetic field by sensing the effect of the magnetic field to an induction coil according to Faraday's law of electromagnetic induction.

A method using the SQUID can measure the magnitude of a magnetic field up to $10^{-10}$ Gauss using flux quantization and the Josephson effect present in a superconducting state.

A vibrating sample magnetometer (VSM) uses Faraday's law of electromagnetic induction associated with an electric field generating a magnetic field varying with time, measures the electric field, and informs a user of information about the varied magnetic field. The VSM is used for measuring magnetic properties associated with a magnetic material serving as a sample.

An alternating gradient field (AGM) is used for extracting periodic force applied to a sample positioned within a varying or direct current (DC) field. The periodic force is proportional to the magnitude of a magnetic field applied to the sample and a magnetic moment of the sample.

The periodic force finely moves the sample. This motion is measured by a sensing part using a piezoelectric material mounted on an arm of a probe. Furthermore, a value of the measured motion is used for producing a value of the magnetic moment and a hysteresis curve associated with the sample.

When polarized light is incident into a magnetic sample and an interaction between the incident light and the magnetic moment within the sample changes a polarization degree, magneto-optical Kerr effect (MOKE) is used for measuring magnetic properties of the sample by measuring a change of the polarization degree.

A magnetic material deposited on a cantilever receives a force caused by an external torque field, and the force finely moves the cantilever. At this point, capacitance varies between the cantilever and an electrically conductive plate formed on a lower part of the cantilever. A capacitance detection cantilever chip magnetometer analyzes properties of a magnetic film deposited on the cantilever using the varied capacitance.

However, the conventional system can monitor the magnetic moments of thin films only after the thin film has been deposited, such that there is a problem in that it cannot monitor the magnetic moment of the thin film during the film deposition.

Furthermore, the conventional monitoring system must perform measurement after the thin film has been deposited and a vacuum has been broken, such that there is a problem in that the thin film is oxidized and a measurement result can be produced only after the thin film has been deposited.

Part of the conventional monitoring system can perform measurement without breaking the vacuum state, but there is still a problem in that a measurement result can be produced only after the thin film has been deposited.

Furthermore, the conventional monitoring system can measure properties of a magnetic film with several Angstrom precision, but cannot measure properties of a magnetic film with sub-angstrom precision, such that there is a drawback in that magnetic properties acquired from a process for depositing a ultra-thin film cannot be examined.

DISCLOSURE OF THE INVENTION

Therefore, the present invention has been made in view of the above and other problems, and it is one object of the present invention to provide an ultra sensitive in-situ magnetometer system that can consecutively monitor magnetic properties of thin film while carrying out a deposition process without breaking a vacuum in the chamber.

It is another object of the present invention to provide an ultra sensitive in-situ magnetometer system that can measure properties of a magnetic thin film with sub-monolayer precision while depositing the magnetic thin film.

It is yet another object of the present invention to provide an ultra sensitive in-situ magnetometer system that can examine magnetic properties of ultra thin magnetic film multi-layers necessary for conducting research on the effect of giant magneto resistance and research on the improvement of the areal memory density of magnetic recording media.

In accordance with a first aspect of the present invention, the above and other objects can be accomplished by the provision of an ultra sensitive in-situ magnetometer system, comprising: a deposition source; a cantilever chip on which magnetic atoms incident from the deposition source are deposited; an interferometer for sensing vibration of the cantilever chip to output an electrical signal; a deposition head for maintaining an appropriate distance between a cleaved end of an optical fiber of the interferometer and a surface of the cantilever paddle; a high voltage amplifier for amplifying an external input voltage; a piezoelectric material oscillated by the amplified voltage from the high voltage amplifier; a lock-in amplifier for detecting a signal from the piezoelectric material; a phase locked loop (PLL) for performing a phase locking operation between a signal output from the interferometer and the signal input to the piezoelectric material; a power amplifier for amplifying an alternating current (AC) voltage output from the lock-in amplifier and applying the amplified AC voltage to the torque coil inside the deposition head; and an oscillator for receiving an output voltage of the interferometer from the lock-in amplifier and monitoring displacement of the cantilever paddle.

The deposition head comprises: a deposition shield in which a deposition hole is formed; a coil attached to an inside wall of the deposition shield for generating a magnetic torque field at a thin film in response to the AC voltage received from the power amplifier; a support plate spaced from the coil and installed on a lower surface of the deposition shield; a permanent magnet or electromagnet fixedly installed on the support plate for arranging the magnetic moment of thin film in one direction; a ceramic material installed on the lower surface of the deposition shield; an electric conductor installed on an upper part of the ceramic material; a lower electrode of the piezoelectric material installed on one end of the electric conductor; the piezoelectric material adhered closely to one surface of the ceramic material and installed on an upper part of the electric conductor; a first non-magnetic metal plate installed on an upper part of the piezoelectric material; a deposition hole plate and the cantilever chip installed on the first non-magnetic metal plate; an upper electrode of the piezoelectric material installed on a lower part of the first non-magnetic metal plate; a second non-magnetic metal plate installed on a photoresist; and screws fixed to an upper plate to the second non-magnetic metal plate, and wherein the optical fiber is positioned in the center of the second non-magnetic metal plate and is installed closely to the second non-magnetic metal plate to keep 5–10 microns gap between the cleaved fiber end the surface of cantilever paddle when the four screws are tighten up.

In accordance with a second aspect of the present invention, the above and other objects can be accomplished by the provision of an ultra sensitive in-situ magnetometer system, comprising: a deposition source; a cantilever chip in which a cleaved fiber end is faced on one side of a cantilever paddle of the chip and magnetic atoms incident from the deposition source are deposited on the other side of the cantilever paddle surface of the chip; a power amplifier for rectifying an external input voltage to vary an amplitude of the rectified voltage and the varied amplitude; an interferometer for sensing vibration of the cantilever paddle to an electrical output signal; a deposition head comprising the cantilever chip therein for maintaining an appropriate distance between an cleaved fiber end of the interferometer and a surface of the surface of cantilever paddle; a lock-in amplifier for sensing a signal output from the interferometer; a phase locked loop (PLL) for sensing a signal output from the interferometer, performing a phase locking operation based on the signal from the interferometer and a signal input to the torque coil, and eliminating the frequency shift due to mass loading effect to the final magnetic signal during the film deposition; a computer for storing an output signal of the interferometer from the lock-in amplifier; the torque coil for generating an alternating current (AC) torque field by means of an AC voltage output from the power amplifier; and an electromagnet for generating a bias field due to an applied external electric current.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Embodiment 1

Now, an ultra sensitive in-situ magnetometer system in accordance with the present invention will be described.

Figure 1:
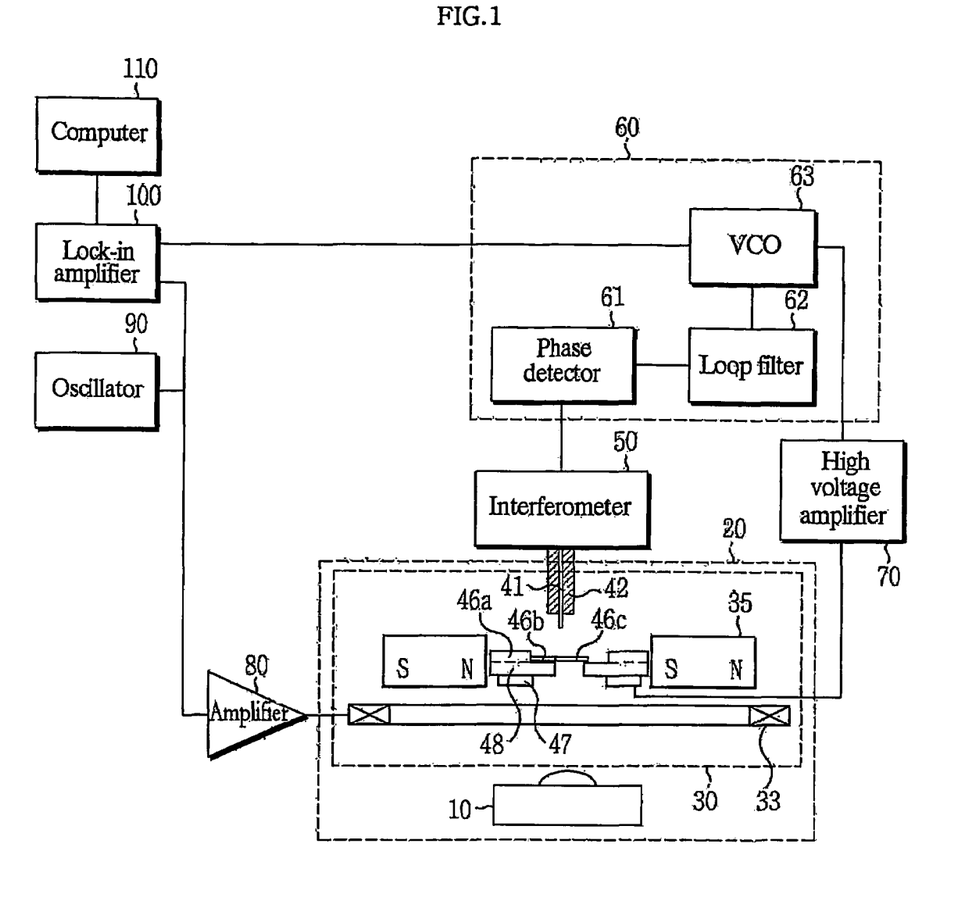
FIG. 1 shows one embodiment of a magnetometer system in accordance with the present invention.

As shown in FIG. 1, the system in accordance with the present invention comprises a deposition source 10, a deposition head 30, an interferometer 50, a phase locked loop (PLL) 60, a high voltage amplifier 70, a power amplifier 80, an oscillator 90, a lock-in amplifier 100 and a computer 110. The PLL 60 consists of three parts of a phase detector 61, a loop filter 62, and a voltage controlled oscillator (VCO) 63.

First, the deposition source 10 and the deposition head 30 are installed inside an ultra high vacuum (UHV) chamber 20. The deposition source 10 plays a role in supplying magnetic atoms to the lower surface of cantilever paddle 46c of a cantilever chip 46 within the deposition head 30. The deposition head 30 maintains an appropriate distance between the cleaved fiber 40 of the interferometer 50 and a surface of the cantilever paddle of the chip 46c, and fixes a sample.

The interferometer 50 above the UHV chamber 20 is attached outside the UHV chamber 20, and is connected to the deposition head 30 via a feed-through by the optical fiber 40 and electric lines which supply the current to the torque coil and electromagnet. The interferometer 50 senses vibration of the cantilever paddle of the chip 46c inside the deposition head 30 and then convert to an electrical output signal. Furthermore, the interferometer 50 is configured by a laser diode, a temperature controller, a direction coupler, a laser diode driver, a laser mount, and an optical detector.

The signal from the interferometer 50 is transferred to the PLL 60. As described above, the PLL 60 consists of the three parts of the phase detector 61, the loop filter 62, and the VCO 63.

The PLL 60 has a function for fixedly maintaining a phase difference of 180° between a signal input to the piezoelectric material 47 and a signal output from the interferometer 50. Thus, the motion of the cantilever paddle 46c caused by the magnetic torque acting on the magnetic film deposited on the paddle surface is cancelled, and thus a resonance frequency shift due to mass loading effect during the film deposition is minimized. The signal input to the piezo material is used as a magnetic moment of the film.

The high voltage amplifier 70 amplifies a fine signal output from the PLL 60 and then supplies it to the piezoelectric material 47. That is, as the amplified output signal from the high voltage amplifier 70 is supplied to the piezoelectric material 47, the vibration of the cantilever paddle 46c generated by the magnetic torque is minimized and thus the mass loading and thermal drifting effect during the film deposition are minimized.

The piezoelectric material 47 vibrates with 180° phase inversion, the same resonance frequency and the same amplitude of output signal from laser interferometer. This vibration cancels out the vibration of the cantilever paddle 46c due to the magnetic film on the paddle. The lock-in amplifier 100 performs a function for sensing the phase inversion signal output from the VCO 63 and transferring the sensed signal to a monitoring system as the magnetic film information of the film with a storage medium such as a computer 110.

The power amplifier 80 amplifies an alternative voltage (ACV) output from the lock-in amplifier 100, and then supplies the amplified AC voltage to a torque coil 33 within the deposition head 30. At this point, the AC voltage from the power amplifier 80 is corresponding to a resonance frequency of the cantilever paddle 46.

Furthermore, the oscillator 90 recognizes the inherent motion of the cantilever paddle 46c and the cancelled motion of the cantilever paddle 46c so that an observer can make sure the cantilever motion is cancelled out.

The inherent motion of the cantilever paddle 46c indicates motion when torque is applied to the magnetic moment of the thin film and hence the cantilever paddle 46c on which the thin film is deposited is vertically vibrated. The cancelled motion of the cantilever paddle 46c indicates motion when the phase inversion signal output from the VCO 63 is supplied to the piezoelectric material 47 and hence the inherent motion of the cantilever paddle 46c is cancelled.

Figure 2:
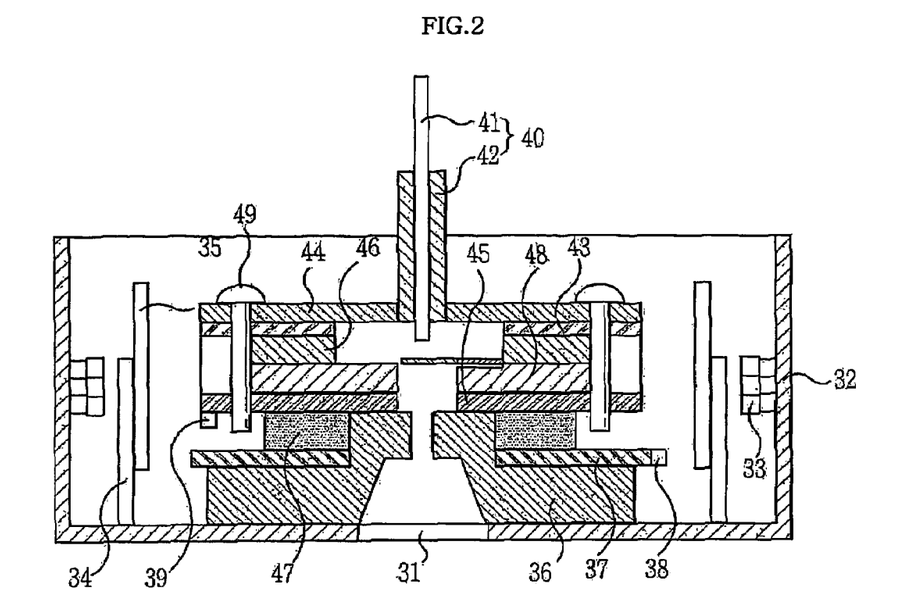
FIG. 2 is a cross-sectional view illustrating a deposition head applied in FIG. 1.

Now, a configuration of the deposition head 30 will be described.

As shown in FIG. 2, the deposition head 30 has a structure in which a deposition hole 31 is formed at the bottom of the center of a cylinder-shaped deposition shield 32. The deposition shield 32 protects all components in the deposition head 30 from all possible unexpected deposition of atoms during film deposition.

A torque coil 33 is attached to an inside wall of the cylinder-shaped deposition shield 32. The coil 33 generates an AC magnetic torque field.

A support plate 34 spaced from the coil 33 is vertically installed on the bottom of cylinder-shaped deposition shield 32. A Samarium Cobalt (SmCo) permanent magnet or electromagnet 35 is fixedly installed on the support plate 34 faced each other. The SmCo permanent magnet or electromagnet 35 generates bias field and arranges the magnetic moments of thin film deposited on the cantilever paddle placed at the center between two bias field magnets. The support plate 34 supports the magnets 35, and is configured by a material compatible with ultra-high vacuum (UHV).

A ceramic material 36 is installed on the lower surface of the cylinder-shaped deposition shield 32. The ceramic material 36 is installed to electrically isolate the deposition shield 32 and a lower electrode 38 of the piezoelectric material 47. In this case, the deposition shield 32 is configured by a material compatible with UHV, and the ceramic material 36 is an insulation material compatible with UHV.

An electric conductor 37 mounted on the upper part of the insulation material 36 serves as a lower electrode, and is electrically coupled to the lower electrode 38 of the piezoelectric material 47 on the right side of the electric conductor 37 in FIG. 2. The lower electrode 38 of the piezoelectric material 47 applies voltage to the electric conductor 37. The electric conductor 37 is configured by a material compatible with UHV.

The piezoelectric material 47 adhered closely to one side of the ceramic material 36 is installed on the upper part of the electric conductor 37. The piezoelectric material 47 generates feedback vibration for cancelling out the motion of the cantilever paddle 46c. All conductor materials used here are non-magnetic materials.

A first non-magnetic metal plate 45 is installed on the piezoelectric material 47. An upper electrode 39 of the piezoelectric material 47 is installed on the lower surface of the first non-magnetic metal plate 45. The upper electrode 39 of the piezoelectric material 47 applies voltage to a second non-magnetic metal plate 44.

The cantilever chip (a combined structure of deposition hole plate 48 and the cantilever 46 by ionic bonding) is installed on the upper part of the first metal plate 45.

Figure 3:
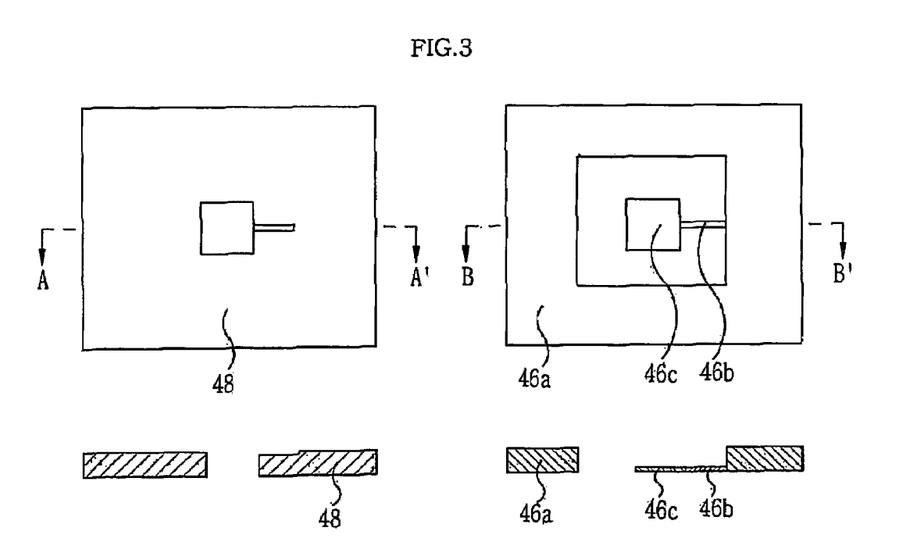
FIG. 3 shows structures of a cantilever and a deposition hole plate.

FIG. 3 shows structures of the cantilever 46 and the deposition hole plate 48. As shown in FIG. 3, the cantilever 46 is divided into three parts of a frame 46a, a leg 46b, and a paddle 46c.

Figure 4:
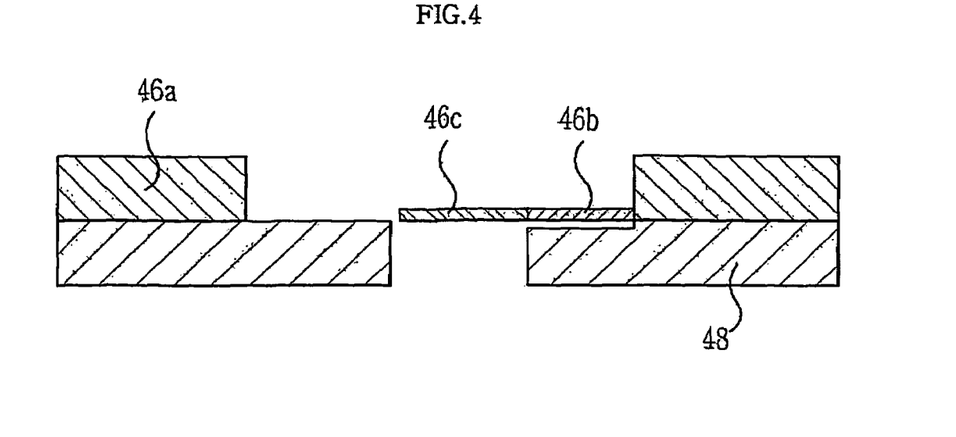
FIG. 4 is a cross-sectional view illustrating a structure in which the cantilever and the deposition hole plate are coupled (cantilever chip)
Figure 5:
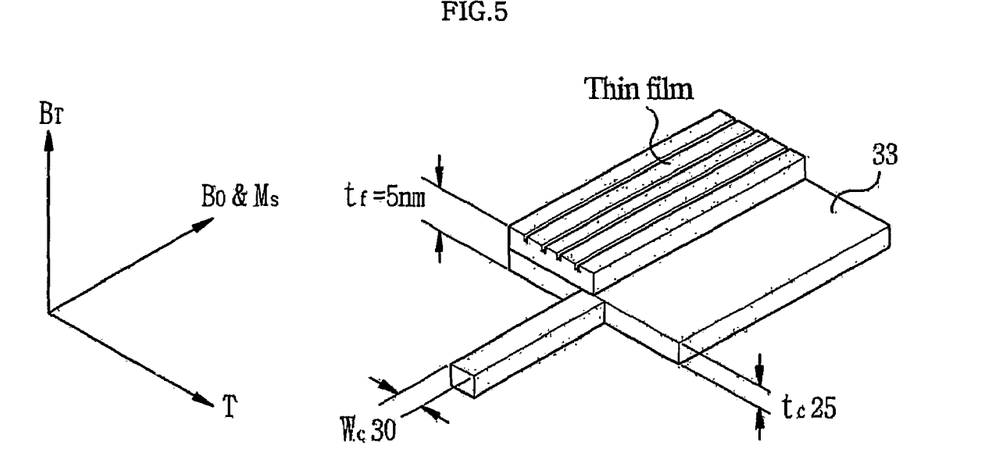
FIG. 5 is a general view illustrating the cantilever chip and a thin film.

FIG. 4 shows a structure in which the cantilever 46 and the deposition hole plate 48 are coupled (cantilever chip).

As shown in FIG. 4, the deposition hole plate 48 and the cantilever 46 are coupled to each other. The deposition hole plate 48 prevents the thin film deposition on the leg 46b of the cantilever 46, and performs a function so that the thin film is deposited only on the cantilever paddle 46c of the cantilever chip. That is, the deposition hole plate 48 and a cantilever are formed into one body that can be called the cantilever chip. The deposition hole plate 48 and the cantilever are bonded by an ionic bonding.

Figure 7:
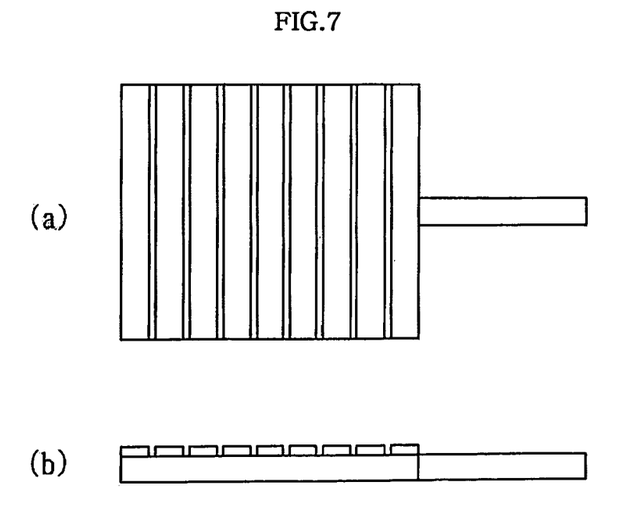
FIG. 7 shows a structure in which grooves are formed on a surface of a cantilever paddle to which the present invention is applied.

As shown in FIG. 7, small and long grooves are formed in the surface of the cantilever paddle 46c to minimize the Eddy current effect during a film deposition.

A photoresist 43 is coated on the cantilever frame 46a of the cantilever. That is, the photoresist 43 is coated only on the upper part of the frame 46a of the cantilever. The photoresist 43 maintains a constant distance between the surface of cantilever paddle 46c of the cantilever chip and the cleaved end of the optical fiber 40. It is preferred that the distance between the paddle 46c of the cantilever and the cleaved end of the optical fiber 40 is range of 5 μm to 10 μm.

The second non-magnetic metal plate 44 is installed on the upper part of the photoresist 43, and is combined with the first non-magnetic metal plate 45 by screws 49. The cantilever chip is coupled to the non-magnetic metal plate 39 serving as the upper electrode of the piezoelectric material 47 through the first non-mgnetic metal plate 45.

That is, the second non-magnetic metal plate 44 is configured by a material compatible with UHV such as Cu. The second non-magnetic metal plate 44 and the optical fiber 40 are configured into one body. The sample is removed by separating four screws 49.

In the case of sample replacement, the four screws are released and then the cantilever chip of FIG. 4 can be removed. A new cantilever chip is positioned on the first non-magnetic metal plate 45, and the second non-magnetic metal plate 44 and the optical fiber 40 configured into one body are positioned on the new cantilever chip. The first and second non-magnetic metal plates 45 and 44 are combined by the four screws 49.

The optical fiber 40 is fixed at the center of second non-magnetic metal plate 44. A basic structure of the optical fiber 40 consists of a fiber core 41 and a clad 42. A diameter of the fiber core 41 is approximately 5 μm, and the optical fiber 40 can use a single-mode optical fiber with a wavelength of 780 nm. Alternatively, a multi-mode optical fiber with infrared wavelength also can be used for this invention.

Now, a function of the ultra sensitive in-situ magnetometer system constituted as described above will be described.

As shown in FIG. 1, magnetic atoms from the deposition source 10 are deposited on the lower surface of the cantilever paddle 46c placed inside of deposition head 30 during the film deposition. The magnetic atoms deposited on the lower surface of the cantilever paddle 46c of are grown during the film deposition and start to form a thin film.

The SmCo permanent magnet or electromagnet 35 creates a bias field at the position where the cantilever chip is located. The magnetic moments of the thin film are fully aligned parallel to the direction of applied bias field.

At this point, the power amplifier 80 coupled to the RF torque coil 33 supplies, to the coil 33, a sinusoidal signal with a resonance frequency of the cantilever paddle 46c, that is, a signal supplied from VCO.

The sinusoidal voltage signal supplied to the torque coil 33 generates an alternating current (AC) torque field.

Figure 6:
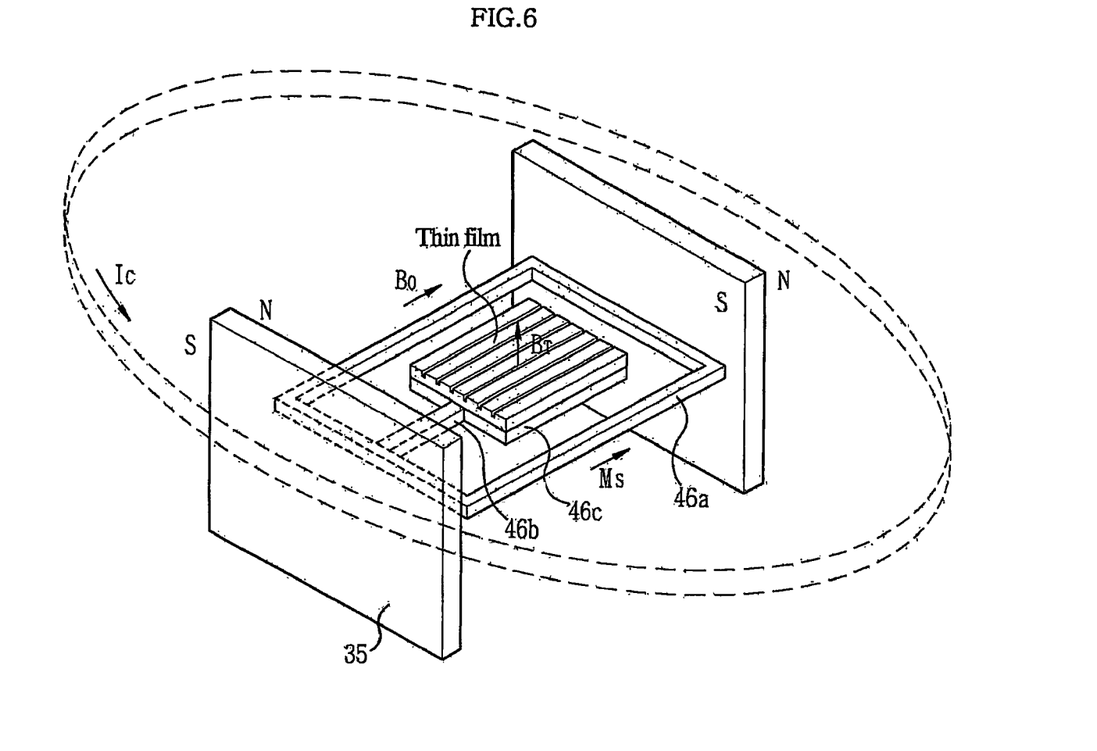
FIG. 6 is an explanatory view illustrating a principle in which torque is applied to the cantilever chip on which a thin film is deposited.

Thus, the generated AC torque field is also applied perpendicular to the surface of thin film deposited on the paddle and then generates the magnetic torque that makes vertical vibration of cantilever paddle.

The resonance frequency of the cantilever paddle 46c depends upon the thickness of the cantilever 46. The resonance frequency must be over than 2 KHz, because electric noise and room noise are serious under the resonance frequency 2 KHz. The resonance frequency can be controlled by the thickness of the cantilever 46. Therefore the cantilever 46 operates at the resonance frequency over than 2 KHz The resonance operation has an advantage of Q enhancement as $Z_r = Z \times Q$ where Q is a mechanical quality factor of the cantilever 46.

The torque applied to the magnetic thin film can be written as $T_M = m \times B_T = \mu_0 m H_T$. The displacement of the cantilever paddle 46c due to torque applied to the magnetic thin film on the paddle also can be written as;.

$$Z = 6 T_M l_c^2 / E w_c t_c^3 = 6 \mu_0 m H_T l_c^2 / E w_c t_c^3 = 6 \mu_0 M_s t_f a_f H_T l_c^2 / E w_c t_c^3,$$

where $l_c$ denotes the length of the cantilever leg 46b, $\mu_0$ denotes the permeability of free space, $M_s$ denotes the saturation magnetization of deposited film, $a_f$ denotes the deposited film area, $T_M$ denotes the magnetic torque acting on the paddle, $w_c$ denotes the width of the cantilever leg 46b, $t_c$ denotes the thickness of the cantilever 46, and $t_f$ denotes the thickness of film. E is Young's modulus of silicon.

The vibration of the cantilever paddle 46c is sensed by the laser diode interferometer 50. A signal sensed by the laser diode interferometer 50 is converted into a sinusoidal signal based on a phase inversion of 180° through the PLL 60, and the converted signal is supplied to the piezo material through amplifier. to cancel out the cantilever paddle motion. The laser wavelength of laser diode can be adjustable for best fringe visibility by adjusting the temperature of laser diode.

The 180° phase inversion of the output signal from lock-in amplifier in the PLL 60 will be described as below.

First, the phase detector 61 within the PLL 60 measures a phase difference between the signal output from the interferometer 50 and the signal input to the piezoelectric material 47, with a DC voltage.

The loop filter 62 filters the output signal from the phase detector 61 and sends it to voltage controlled oscillator.

The output signal from the loop filter 62 is converted into a sinusoidal signal based on the 180° phase inversion through the VCO 63. The phase is locked through a feedback based on the phase detector 61, the loop filter 62, and VCO such that a phase locked signal is supplied to the piezoelectric material 47 through the high voltage amplifier 70.

The high voltage amplifier 70 performs a function of amplifying phase inversion signal output from the VCO 63. The lock-in amplifier 100 senses the 180° phase inversion output signal that is supplied to piezo material as the magnetic information of deposited film.

The phase inversion signal output from the PLL 60 is fed back to the piezoelectric material 47, positioned below the cantilever chip, through the high voltage amplifier 70. The vibration of the cantilever paddle 46c associated with the magnetic torque is cancelled out. This process is referred to as an active feedback.

Through the active feedback, the cantilever paddle 46c returns to a state in which vibration is almost not present. The mass of the cantilever paddle 46 is increased when the magnetic atoms from the deposition source 10 are moved to the lower surface of the cantilever paddle 46c during the film deposition—and thus the resonance frequency of the cantilever will be slightly shifted to lower. It is so called mass loading effect that is minimized when the active feedback is on. Also the phase shifting due to thermal effect will be minimized by active feedback.

The inherent motion and cancelled motion of the cantilever paddle 46c are observed by means of the signal output from the interferometer 50 sensing the inherent motion of the cantilever paddle 46c through the oscillator 80 and the signal fed back to the piezoelectric material 47.

The phase inversion signal passing through the PLL 60 is fed back to the piezoelectric material 47 through the high voltage amplifier 70, and the amplitude of the phase inversion signal can be converted into the magnetic moment of the thin film. The phase inversion signal is sensed by the lock-in amplifier 100 and is recorded through a storage medium such as the computer 110.

The lock-in amplifier 100 is not affected by the noise, and is used for accurate measurement.

The amplitude of the phase inversion signal fed back to the piezoelectric material 47 is proportional to the magnetic moment of the thin film deposited on the cantilever paddle. During the deposition process, the magnetic moment is measured.

At this point, the following formula is required to convert the amplitude of the signal sensed by the interferometer 50 into the magnetic moment so that the measured magnetic moment of the thin film can be compared with a theoretical value.

$$M_s t_f a_f = E w_c t_c^3 \lambda \Delta V / 24 \pi \mu_0 H_T l_c^2 V V_0.$$

Where, $\lambda$ denotes a laser wavelength, $\Delta V$ denotes a measurement value when the lock-in amplifier measures a signal corresponding to a magnetic moment change due to the film deposition, V and $V_0$ are the fringe visibility and midpoint voltage respectively defined by $$V = \frac{(V_{max} - V_{min})}{(V_{max} + V_{min})}, \quad V_0 = \frac{(V_{max} + V_{min})}{2}$$

where $V_{max}$, and $V_{min}$ are the voltage corresponding to maximum constructive and destructive interference respectively. V and $V_0$ is the characteristics of laser interferometer.

Embodiment 2

Figure 8:
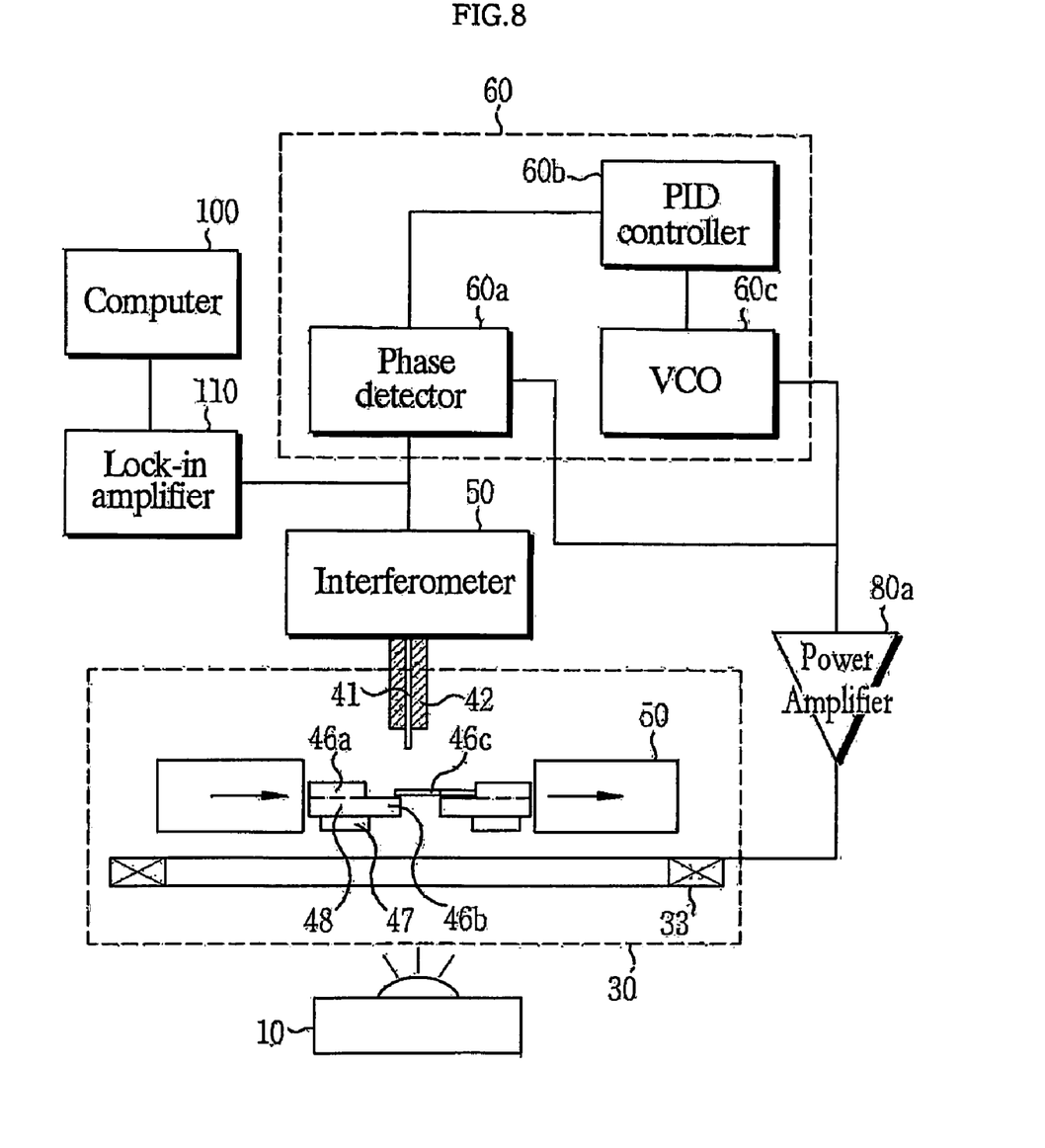
FIG. 8 shows another embodiment of the magnetometer system in accordance with the present invention.
Figure 9:
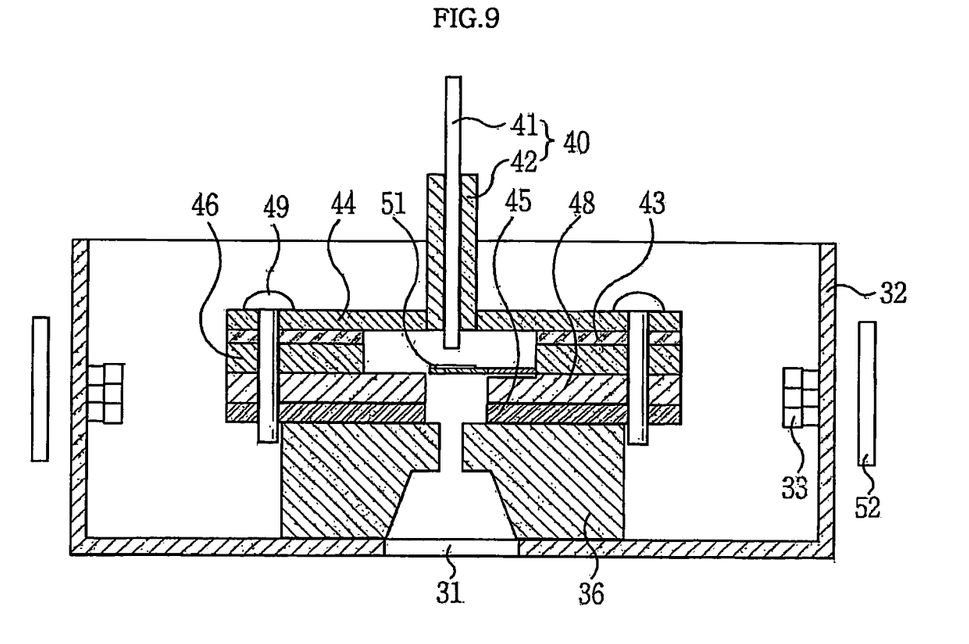
FIG. 9 is a cross-sectional view illustrating a deposition head applied in FIG. 8.

FIGS. 8 and 9 show another embodiment of the ultra sensitive in-situ magnetometer system in accordance with the present invention. The ultra sensitive in-situ magnetometer system comprises: a deposition source 10; a cantilever chip in which a standard NiFe film 51 is deposited on one surface of a cantilever paddle corresponding to an optical fiber avoid using piezo material and magnetic atoms incident from the deposition source 10 are deposited on the other surface of the cantilever paddle; an interferometer 50 for outputting an electrical signal by sensing vibration of the cantilever paddle 46c; and the cantilever chip as explained in the previous invention. The ultra sensitive in-situ magnetometer system further comprises: a deposition head 30 for maintaining an appropriate distance between the cleaved fiber end of the interferometer 50 and the surface of the cantilever paddle 46c; a power amplifier 80a for rectifying voltage input from a phase locked loop (PLL) 60 and varying an amplitude of the voltage to output the varied amplitude; the PLL 60 for sensing a signal output from the interferometer 50, sensing a phase difference between the sensed signal from interferometer and a signal input to the torque coil 33, locking a phase through a feedback so that the phase difference always equals to the phase value preset in a PID(proportional integral derivative) controller of the PLL 60 during the measurement, and measuring an output signal of cantilever paddle vibration eliminating the effect of a resonance frequency shifting due to a mass loading effect during the film deposition process; a computer 110 for storing the interferometer from the lock-in amplifier 100; the torque coil 33 for generating an alternating current (AC) torque field in response to an AC voltage output from the power amplifier 80a; and an electromagnet 52 for generating a bias field in response to an external DCV.

A function of the ultra sensitive in-situ magnetometer system constituted as described above will be described.

During the film deposition, the magnetic atoms from the deposition source 10 are emitted and deposited on the lower surface of the cantilever paddle 46c inside the deposition head 30. The magnetic atoms deposited on the lower surface of the cantilever paddle 46c forms a thin film.

The electromagnet 52 generates the bias field at the place where the cantilever chip is located. The magnetic moments of thin film are aligned parallel to the direction of bias field.

In response to the AC voltage supplied from the power amplifier 80a coupled to the RF torque coil 33, an AC torque field is generated and applied perpendicular to the surface of the film deposited on the cantilever paddle.

Thus, the AC torque field generated by the torque coil and the bias field generated by the electromagnet 52 make the cantilever paddle 46c vibrate with the resonance frequency. Where the film deposited on the paddle surface faced on the cleaved fiber end is standard Permalloy film that is used to find the resonance frequency of cantilever paddle instead of using piezo material in the previous invention. This film has the exactly same function as that of the piezo material did in the previous invention. The only difference of this configuration to find the resonance frequency of the cantilever paddle is the vibration using magnetic excitation instead of piezo excitation.

The resonance frequency of the cantilever paddle 46c depends upon the thickness of the cantilever 46. The resonance frequency must be over than 2 KHz, because electric noise and room noise are serious when the resonance frequency is under 2 KHz. The resonance frequency can be controlled by the thickness of the cantilever 46. For the reason, the cantilever 46 operates at the resonance frequency over than 2 KHz.

The vibration of the cantilever chip 46 is sensed by the laser diode interferometer 50. The PLL 60 (phase detector, PID controller and voltage-controlled oscillator) that has slightly different configuration compared to the previous invention performs a phase locking operation between the signal sensed by the laser diode interferometer 50 and the signal input to the torque coil 33 with the value preset in PID. Therefore, the phase difference between two signals described above are kept the same during the film deposition even if the resonance frequency is changed by the mass loading effect; It means the PLL always tracks the phase changes due to mass loading or thermal drifting effect. The locked signal from VCO of PLL is supplied to the torque coil 33 through the power amplifier 80a.

The above-described phase locking eliminates the mass loading effect or possible phase changes effect due to thermal effect or mechanical vibration of the chamber from the final magnetic signal during the film deposition.

The amplitude of signal sensed by the interferometer 50 is proportional to the magnetic moment of thin film deposited on the cantilever paddle. The lock-in amplifier 100 outputs the sensed signal to a monitoring system with a storage medium such as the computer 110.

Although the preferred embodiments of the present invention have been disclosed for illustrative purposes, those skilled in the art will appreciate that various modifications, additions and substitutions are possible, without departing from the scope of the invention. Therefore, the present invention is not limited to the above-described embodiments, but the present invention is defined by the claims which follow, along with their full scope of equivalents.

INDUSTRIAL APPLICABILITY

As apparent from the above description, the present invention allows an observer to observe all of a magnetic film deposition process using an in-situ monitoring system.

In accordance with the present invention, properties of a thin film can be observed with sub-Angstrom precision or more while a magnetic thin film is deposited, and atom-level deposition can also be sensed.

The present invention can minimize the mass loading effect by increasing the mass of the cantilever chip while moving magnetic atoms from a deposition source to the lower surface of the cantilever paddle, and can minimize the effect of elastic modulus according to a temperature change, during the film deposition using an active feedback system.

In accordance with the present invention, the magnetic film properties such as hysteresis curve, anisotropy energy also can be observed by sweeping the magnetic field from negative to positive using electromagnet that generates bias field without breaking a vacuum of the chamber.

The invention claimed is:

1. An ultra sensitive in-situ magnetometer system, comprising:
   a deposition source;
   a cantilever paddle of the chip on which magnetic atoms incident from the deposition source are deposited;
   an interferometer for sensing vibration of the cantilever paddle of the chip to output an electrical signal;
   a deposition head for maintaining an appropriate distance between a cleaved fiber end of the interferometer and the surface of a cantilever paddle of the chip;

a high voltage amplifier for amplifying the signal that is supplied to piezo material; a piezoelectric material oscillated by the amplified voltage from the high voltage amplifier;

a lock-in amplifier for detecting a signal from the piezoelectric material;

a phase locked loop (PLL) for performing a phase locking operation between a signal output from the interferometer and the signal input to the piezoelectric material;

a power amplifier for amplifying an alternating current (AC) voltage output from the lock-in amplifier and applying the amplified AC voltage to the torque coil inside the deposition head; and an oscillator for receiving an output voltage of the interferometer from the lock-in amplifier and monitoring displacement of the cantilever paddle.

2. The ultra sensitive in-situ magnetometer system of claim 1, wherein the signal generated from the PLL cancels out the vibration of the cantilever paddle.

3. The ultra sensitive in-situ magnetometer system of claim 1, wherein the interferometer that can adjust the laser wavelength to find the best fringe and visibility by controlling the temperature of a laser diode.

4. The ultra sensitive in-situ magnetometer system of claim 1, wherein the PLL comprises:
a phase detector for generating a direct current (DC) voltage corresponding to a phase difference between the signal input from the laser interferometer and the signal output to the piezoelectric material;
a loop filter for filtering a signal output from the phase detector; and
a voltage controlled oscillator (VCO) for receiving a signal output from the loop filter to convert the received signal into a sinusoidal signal with 180° phase inversion and output the converted signal and keeping the phase difference by feeding back the sinusoidal signal to the phase detector.

5. The ultra sensitive in-situ magnetometer system of claim 1, wherein the deposition head comprises:
a deposition shield in which a deposition hole is formed;
an insulation material installed on the deposition shield, the insulation material comprising a hollow body and a hollow protrusion formed on the body;
an electric conductor(non-magnetic) coupled to the protrusion;
a piezoelectric material installed on an upper part of the electric conductor;
a first non-magnetic metal such as copper plate in which an upper electrode of the piezoelectric material is formed on one side of a lower end of the first non-magnetic metal plate, the first non-magnetic metal plate being installed on an upper part of the piezoelectric material;
the cantilever chip installed on an upper part of the first non-magnetic metal plate;
a photoresist stacked on an upper part of a frame of the cantilever;
a second non-magnetic metal or copper plate coupled to the optical fiber;
a support plate vertically coupled to the deposition shield;
a permanent magnet supported by the support plate; and
a torque coil attached to the inner side of the deposition shield, and
wherein the first and second non-magnetic or copper plates are coupled by screws.

6. The ultra sensitive in-situ magnetometer system of claim 5, wherein the insulation material is ceramic.

7. The ultra sensitive in-situ magnetometer system of claim 5, wherein the deposition shield protects the inner parts of the deposition head during the film deposition.

8. The ultra sensitive in-situ magnetometer system of claim 5, wherein the support plate is an electrically conductive metal (non-magetic) or ceramic.

9. The ultra sensitive in-situ magnetometer system of claim 5, wherein the insulation material is for insulation between the deposition shield and the lower electrode of the piezoelectric material.

10. The ultra sensitive in-situ magnetometer system of claim 5, wherein the non-magnetic electric conductor is configured by a material compatible with UV.

11. The ultra sensitive in-situ magnetometer system of claim 5, wherein the lower electrode applies voltage to the non-magnetic electric conductor.

12. The ultra sensitive in-situ magnetometer system of claim 5, wherein the piezoelectric material generates feedback vibration to cancel out the motion of the cantilever paddle.

13. The ultra sensitive in-situ magnetometer system of claim 5, further comprising a deposition hole plate being configured by Si, wherein a thin film is deposited only on the paddle except for the leg of the cantilever.

14. The ultra sensitive in-situ magnetometer system of claim 5, wherein the photoresist is spaced from the paddle of the cantilever and the cleaved fiber end by a predetermined distance.

15. The ultra sensitive in-situ magnetometer system of claim 1, wherein small and long grooves are formed so that the effect of Eddy current can be minimized during a film deposition.

16. An ultra sensitive in-situ magnetometer system, comprising:
a deposition source;
a cantilever chip in which a cleaved fiber end is faced on one side of a cantilever paddle of the chip and magnetic atoms incident from the deposition source are deposited on the other side of the cantilever paddle surface of the chip;
a power amplifier for rectifying an external input voltage to vary an amplitude of the rectified voltage and the varied amplitude;
an interferometer for sensing vibration of the cantilever paddle to an electrical output signal;
a deposition head comprising the cantilever chip therein for maintaining an appropriate distance between an cleaved fiber end of the interferometer and a surface of the cantilever paddle;
a lock-in amplifier for sensing a signal output from the interferometer;
a phase locked loop (PLL) for sensing a signal output from the interferometer, performing a phase locking operation based on the signal from the interferometer and a signal input to the torque coil, and eliminating the frequency shift due to mass loading effect to the final magnetic signal during the film deposition;
a computer for storing an output signal of the interferometer from the lock-in amplifier;
the torque coil for generating an alternating current (AC) torque field by means of an AC voltage output from the power amplifier; and
an electromagnet for generating a bias field due to an applied external DC V.

* * * * *